United States Patent
You et al.

(10) Patent No.: US 6,570,161 B2
(45) Date of Patent: May 27, 2003

(54) X-RAY DETECTING DEVICE AND FABRICATING METHOD THEREOF

(75) Inventors: Myung Ho You, Kumi-shi (KR); Byoung Ho Lim, Kumi-shi (JP)

(73) Assignees: LG Philips LCD Co., Ltd., Seoul (KR); Sang Hee Nam, Pusan (KR)

( * ) Notice: Subject to any disclaimer, the term of this patent is extended or adjusted under 35 U.S.C. 154(b) by 36 days.

(21) Appl. No.: 09/749,671

(22) Filed: Dec. 28, 2000

(65) Prior Publication Data

US 2001/0011705 A1 Aug. 9, 2001

(30) Foreign Application Priority Data

Dec. 31, 1999 (KR) ............................................. 99-68054

(51) Int. Cl.[7] .............................................. H01L 25/00
(52) U.S. Cl. .................................. 250/370.09; 250/580
(58) Field of Search ........................ 250/370.09, 214.1, 250/580; 257/59; 349/44, 440, 444, 38, 43, 122, 187; 438/30

(56) References Cited

U.S. PATENT DOCUMENTS

| | | | | |
|---|---|---|---|---|
| 4,582,395 A | * | 4/1986 | Morozumi | 350/334 |
| 5,422,293 A | * | 6/1995 | Konya | 437/50 |
| 5,917,199 A | * | 6/1999 | Byun et al. | 257/59 |
| 5,974,061 A | * | 10/1999 | Byren et al. | 372/34 |
| 6,060,714 A | * | 5/2000 | Zhong et al. | 250/370.09 |
| 6,124,606 A | * | 9/2000 | den Boer et al. | 257/291 |
| 6,297,862 B1 | * | 10/2001 | Murade | 349/44 |
| 6,337,731 B1 | * | 1/2002 | Takemura | 349/187 |

FOREIGN PATENT DOCUMENTS

JP          5346590          12/1993

* cited by examiner

*Primary Examiner*—Constantine Hannaher
*Assistant Examiner*—Otilia Gabor
(74) *Attorney, Agent, or Firm*—Birch, Stewart, Kolasch & Birch, LLP

(57) ABSTRACT

An X-ray detecting device and a fabricating method thereof capable of preventing a short between a lower electrode of a capacitor and a data line are presented. In the device, a data line insulating layer is formed to cover the data line and a gate line. The gate line is exposed through a contact hole defined in the data line insulating. Then a lower electrode is formed on the data line insulating layer and is electrically connected to the gate line via the contact hole. Subsequently, an upper electrode is formed to complete the device. The data line insulating layer prevents a short between the data line and the lower electrode when residual conductive materials are formed when the lower electrode is formed.

34 Claims, 6 Drawing Sheets

X-RAY DETECTING DEVICE AND FABRICATING METHOD THEREOF

BACKGROUND OF THE INVENTION

1. Field of the Invention

This invention-relates to an X-ray detecting device, and more particularly to a liquid crystal display (LCD) X-ray detecting device that is capable of preventing a short between a lower electrode of a capacitor and a data line. Also, the present invention is directed to a method and apparatus for fabricating the X-ray detecting device.

2. Description of the Related Art

Diagnostic X-ray sensor imaging systems, which irradiate X-rays rather than visible light onto an object to photograph an image, are widely used in areas such as medical fields. An X-ray sensor requires a device for detecting the X-ray.

Recently, studies have been conducted where an active matrix liquid crystal display (LCD) is used in the X-ray detecting device. The active matrix LCD uses a thin film transistor (TFT) as a switching device.

Such an X-ray detecting device as described above includes a photo sensitive layer for detecting an X-ray and a thin film transistor substrate for switching and outputting the detected X-ray from the photo sensitive layer. The sensitive layer is formed from selenium, as described in Korean Patent Application No. 1999-36717 (Korean Patent No. 10-0299537) which filed with the Korean Industrial Property Office by the applicant on Aug. 31, 1999. The thin film transistor substrate includes pixel electrodes arranged in a pixel unit, and thin film transistors, each of which is connected to a charging capacitor, a gate line and a data line. The photo sensitive layer produces an electron-hole pair when an X-ray is incident thereto and separates the electron-hole pair when a high voltage of several is applied to the upper electrode. The pixel electrode charges the charging capacitor with holes produced by detection of an X-ray of the photo sensitive layer. The thin film transistor produces a gate signal inputted over the gate line to apply a voltage stored in the charging capacitor to the data line. Pixel signals supplied to the data line are applied, via a data reproducer, to a display device.

FIG. 1 is a sectional view showing a thin film transistor substrate of a conventional X-ray detecting device. The TFT substrate of conventional X-ray detecting device includes a TFT including a gate electrode 13, a gate insulating layer 15, an active layer 17, an ohmic contact layer 19, a source electrode 21 and a drain electrode 23 all on a transparent substrate 11. The conventional TFT substrate also includes a storage capacitor Cst including lower and upper electrodes 29 and 33 and a dielectric layer 31. The TFT substrate further includes a protective layer 35 formed on the TFT and the storage capacitor Cst, and a pixel electrode 37 connected electrically to the upper electrode 33 of the storage capacitor Cst through a contact hole which is formed on the protective layer 35.

The conventional device is arranged at an intersection between a gate line (not shown) and a data line 25. The gate line is connected to the gate electrode 13 and the data line 25 is connected to the source electrode 21. The gate electrode 13 and the insulating layer 15, which cover the gate electrode 13, are formed on the transparent substrate 11. The gate electrode 13 is made from a conductive metal such as aluminum (Al) or copper (Cu) and the gate insulating layer 15 is made from silicon nitride or silicon oxide.

The active layer 17 is formed on the gate insulating layer 15 to overlap with the gate electrode 13, and the ohmic contact layer 19 is formed on the active layer 17 excluding a center portion of the active layer 17. The active layer 17 is made from amorphous silicon or polycrystalline silicon, and the ohmic contact layer 19 is also made from amorphous silicon or polycrystalline silicon. The active layer 17 is not doped, but the ohmic contact layer 19 is doped with either an n-type or p-type impurities at high concentrations.

The source and drain electrodes 21 and 23 are formed on the ohmic contact layer 19 and spaced apart from each other. The source and drain electrodes 21 and 23 are made from molybdenum (Mo), chromium (Cr), titanium (Ti), tantalum (Ta), or from molybdenum alloys such as MoW, MoTa or MoNb, and make an ohmic contact with the ohmic contact layer 19. The source electrode 21 is connected to the data line 25.

The lower electrode 29 of the storage capacitor Cst is formed on the gate-insulating layer 15 and overlaps with a ground line 27. The ground line 27 is formed from the same material as the source and drain electrodes 21 and 23, and is formed by the same process that forms the source and drain electrodes 21 and 23.

The dielectric layer 31 covers the TFT including the lower electrode 29. The upper electrode 33 is formed on the dielectric layer 31 above the lower electrode 29. The dielectric layer 31 is made from silicon nitride or silicon oxide. The lower and upper electrodes 29 and 33 are made from indium tin oxide (ITO), tin oxide (TO) or indium zinc oxide (IZO).

FIGS. 2A to 2E show a process of fabricating a structure having the upper electrode 33 of the storage capacitor Cst on the TFT substrate of the conventional X-ray detecting device shown in FIG. 1. Referring to FIG. 2A, a metal, such as aluminum (Al) or copper (Cu), is deposited on the transparent substrate 11 by the sputtering technique to form a thin metal film. The thin metal film is patterned to form the gate electrode 13, connected to the gate line (not shown), by photolithography including wet etching.

Referring to FIG. 2B, the gate insulating film 15, the active layer 17 and the ohmic contact layer 19 are sequentially formed on the transparent substrate 11 by the chemical vapor deposition (CVD) technique and cover the gate electrode 13. The gate insulating film 15 is formed by depositing an insulation material such as silicon oxide or silicon nitride.

Also, as mentioned above, the active layer 17 is made from amorphous silicon or polycrystalline silicon, and the ohmic contact layer 19 is also made from amorphous silicon or polycrystalline silicon. The active layer 17 is not doped, but the ohmic contact layer 19 is doped with either n or p-type impurities at high concentrations.

The ohmic contact layer 19 and the active layer 17 are patterned by photolithography including anisotropic etching so that a desired portion corresponding to the gate electrode 13 remains.

Referring to FIG. 2C, a metal such as molybdenum (Mo), chromium (Cr), titanium (Ti), tantalum (Ta), or from molybdenum alloys such as MoW, MoTa or MoNb, is deposited on the gate insulating film 15 by the CVD or sputtering technique to cover the ohmic contact layer 19. The metal or the metal alloy so deposited makes an ohmic contact with the ohmic contact layer 19.

Then, the source and drain electrodes 21 and 23 are formed by patterning the metal or the metal alloy by photolithography so that portions corresponding to each side of the active layer 17 remain. At this time, the data line 25 and the ground line 27 are also formed, both of which are perpendicular to the gate line (not shown).

The data line 25 and the ground line 27 are made from the same material as the source and drain electrodes 21 and 23. Further, the ground line 27 is connected to the source electrode 21 (connection not shown).

When the source and drain electrodes 21 and 23 are formed, a portion of the ohmic contact layer 19 between the source and drain electrodes 21 and 23 is patterned to expose the active layer 17. A portion of the active layer 17 above the gate electrode 13 and between the source and drain electrodes 21 and 23 becomes a channel.

Referring to FIG. 2D, a transparent conductive material such as ITO, TO or IZO is deposited on the gate insulating layer 15 covering the data line 25 and the ground line 27. Then the transparent conductive material is selectively removed by photolithography including wet etching to form the lower electrode 29 of the storage capacitor Cst. The lower electrode 29 remains electrically connected to the ground line 27. On the other hand, the lower electrode 29 should not be in contact with the data line 25.

Referring to FIG. 2E, silicon nitride or silicon oxide is deposited on the gate-insulating layer 15 to cover the TFT and the lower electrode 29, thereby forming the dielectric layer 31. The dielectric layer 31 is used as a dielectric film of the storage capacitor Cst.

Subsequently, a transparent conductive material such as indium tin oxide (ITO), tin oxide (TO) or indium zinc oxide (IZO) is deposited on the dielectric layer 31. Then, the transparent conductive material is patterned by photolithography including wet etching to form the upper electrode 33 of the storage capacitor Cst. The upper electrode 33 must be formed directly above the lower electrode 29.

The conventional X-ray detecting device has a problem in that, since the lower electrode of the storage capacitor and the data line are provided on the same plane, a short therebetween may occur during the patterning process due to the presence of residual conductive materials.

SUMMARY OF THE INVENTION

Accordingly, it is an object of the present invention to provide an X-ray detecting device and a fabricating method thereof wherein a data line and a lower electrode of a storage capacitor are formed on a different plane to prevent a short therebetween.

In order to achieve these and other objects of the invention, an X-ray detecting device according to one aspect of the present invention comprises a transparent substrate; a gate electrode formed on the transparent substrate; a gate-insulating layer formed on the transparent substrate covering the gate electrode; an active layer formed on a first portion of the gate-insulating layer over the gate electrode; an ohmic contact layer formed on each side of the active layer such that a center portion of said ohmic contact layer is removed; a thin film transistor including source and drain electrodes formed on the ohmic contact layer; a data line formed on a second portion of the gate insulating layer and electrically connected to the source electrode; a ground line provided on a third portion of the gate-insulating layer; a data line insulating layer formed on the gate insulating layer such that the data line is covered and a contact hole is defined in the date line insulating layer exposing the ground line; a lower electrode contacting the ground line via the contact hole on the data line insulating layer; a dielectric layer formed on the data line insulating layer covering the lower electrode; and an upper electrode formed on the dielectric layer above the lower electrode.

The X-ray detecting device according to another aspect includes a thin film transistor (TFT) structure on a substrate including a data line and a ground line; a data line insulating layer formed on said substrate covering said data and ground lines such that said data line insulating layer has a contact hole exposing said data line; a lower electrode of a storage capacitor on said data line insulating layer above said data line such that said lower electrode is electrically connected to said data line via said contact hole; a dielectric layer formed above said lower electrode; and an upper electrode of said storage capacitor formed on said dielectric layer above said lower electrode.

An aspect of a method of fabricating a X-ray detecting device according to another aspect of the present invention comprises the steps of forming a gate electrode on a transparent substrate; sequentially forming a gate insulating layer, an active layer and an ohmic contact layer covering the gate electrode and patterning the ohmic contact layer and the active layer such that the ohmic contact layer and the active layer remain above the gate electrode on a first portion of the gate insulating layer; forming source and drain electrodes on each side of the active layer, the source and drain electrodes making contact with ohmic contact layer and, at the same time, forming a data line and a ground line at second and third portions, respectively, of the gate insulating layer; forming a data line insulating layer covering the data line and the ground line on the gate insulating layer and then patterning the data line insulating layer to define a contact hole for exposing the ground line; forming a lower electrode on the data line insulating layer contacting the ground line via the contact hole above; forming a dielectric layer on the data line insulating layer covering the lower electrode; and forming an upper electrode on the dielectric layer above the lower electrode.

Another aspect of the method to form the X-ray detecting device includes forming a thin film transistor structure on a substrate including a data line and a ground line; forming a data line insulating layer on the substrate covering said data and ground lines such that said data line insulating layer has a contact hole exposing said data line; forming a lower electrode of a storage capacitor on said data line insulating layer above said data line such that said lower electrode is electrically connected to said data line via said contact hole; forming a dielectric layer above said lower electrode; and forming an upper electrode of said storage capacitor on said dielectric layer above said lower electrode.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
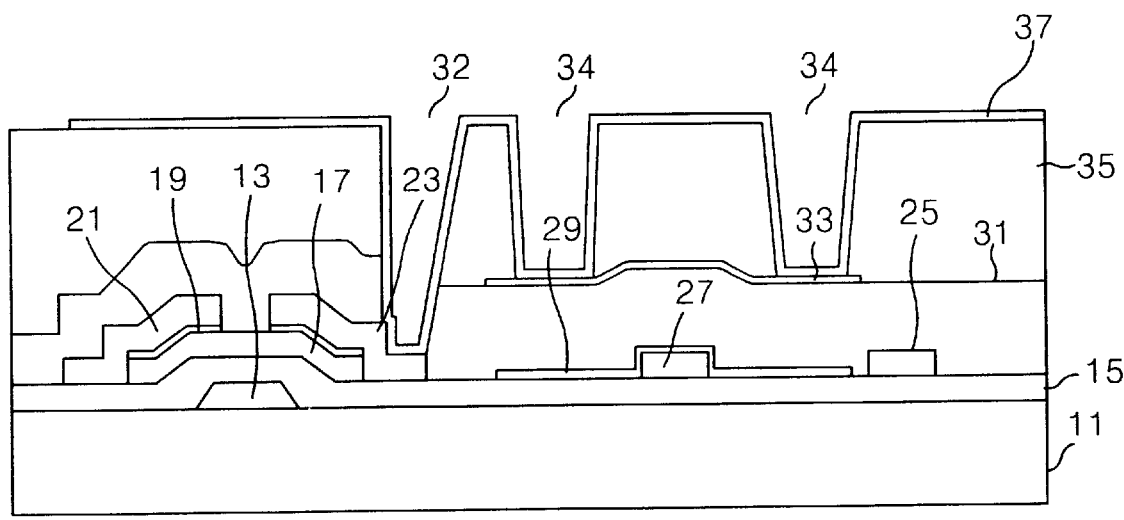
FIG. 1 is a sectional view showing a TFT substrate of a conventional X-ray detecting device.
Figure 2A:
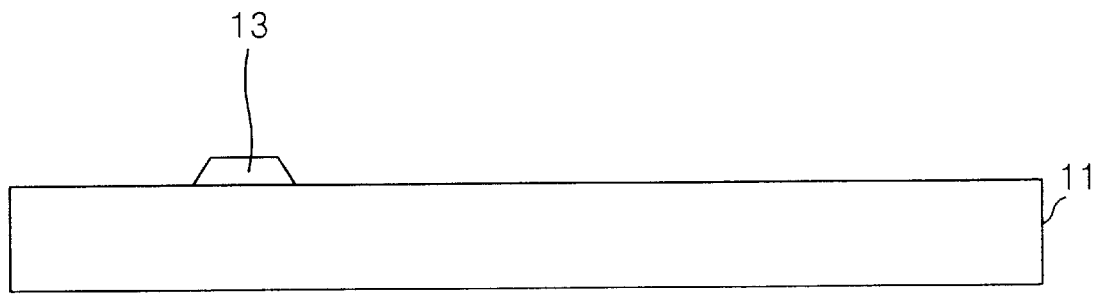
FIG. 2A to FIG. 2E are sectional views representing a process for fabricating the TFT substrate of the conventional X-ray detecting device shown in FIG. 1.
Figure 2B:
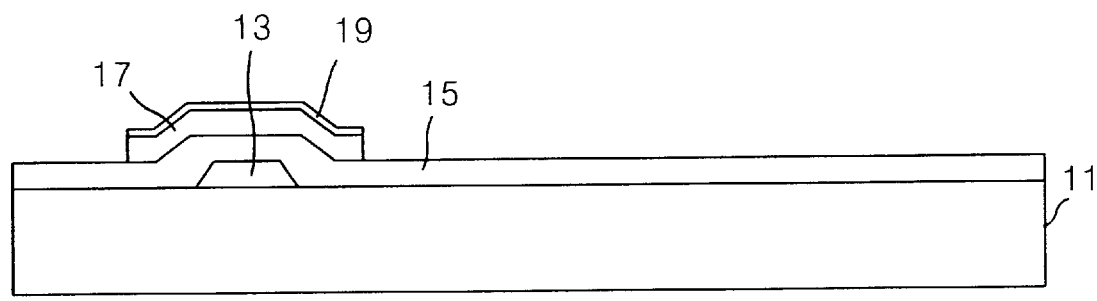
Figure 2C:
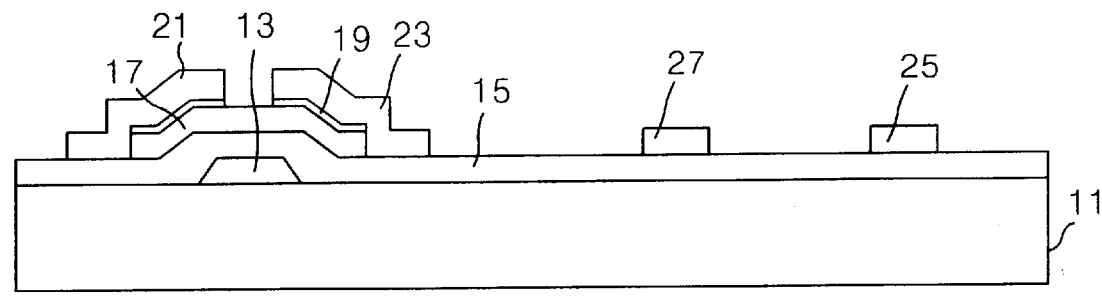
Figure 2D:
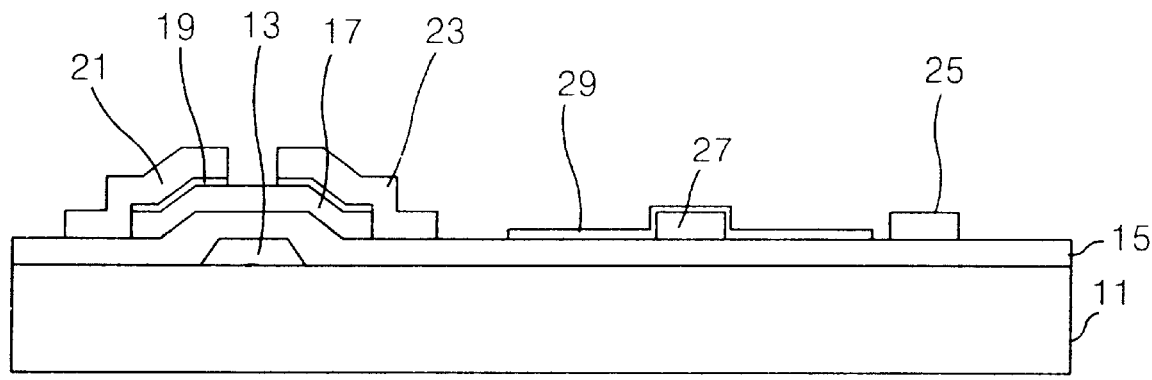
Figure 2E:
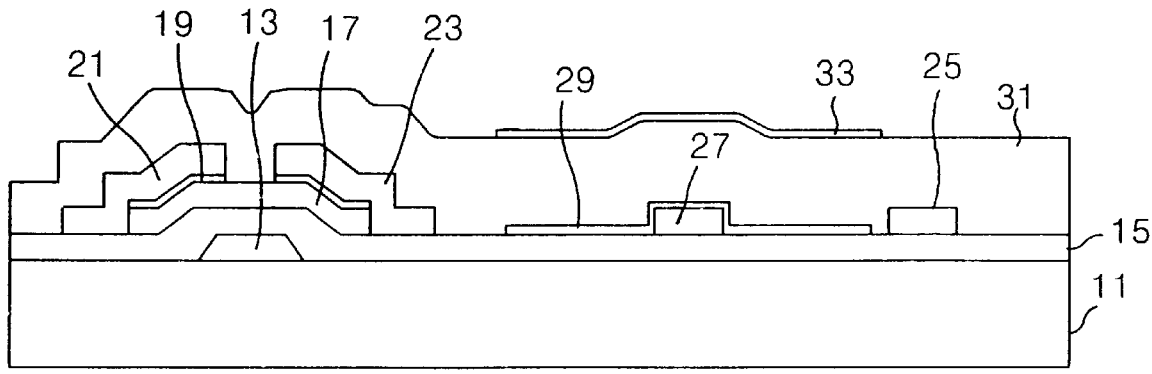
Figure 3:
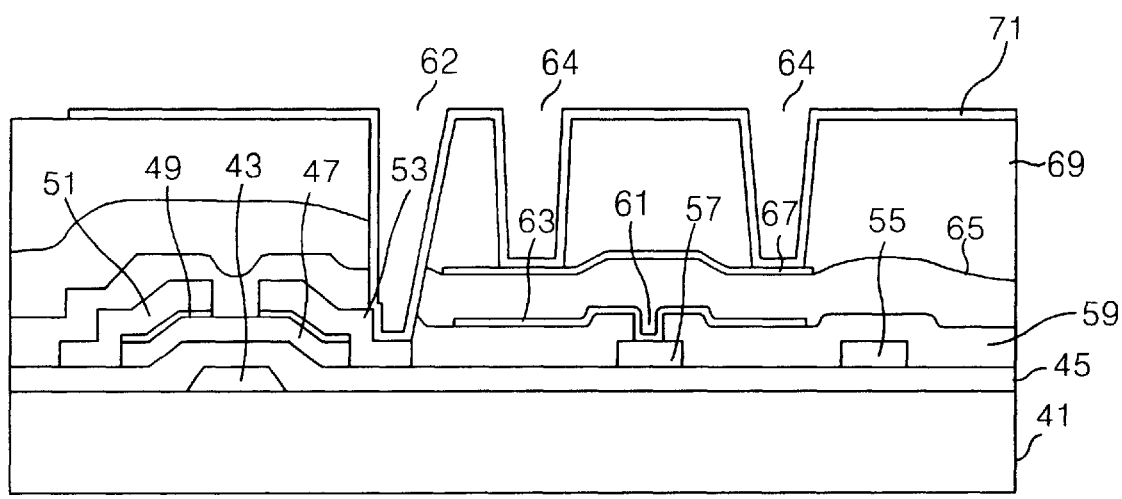
FIG. 3 is a sectional view showing a TFT substrate of an X-ray detecting device according to an embodiment of the present invention.

FIG. 3 is a sectional view showing a TFT substrate of an X-ray detecting device according to an embodiment of the present invention. In the TFT substrate of the X-ray detecting device, it is included a TFT. The TFT includes a gate electrode 43, a gate insulating layer 45, an active layer 47, an ohmic contact layer 49, a source electrode 51 and a drain electrode 53 all on a transparent substrate 41. The TFT substrate also includes a storage capacitor Cst including lower and upper electrodes 63 and 67, a dielectric layer 65. The TFT substrate further includes a protective layer 69 formed on the structure as described above, and a pixel electrode 71 connected electrically to the drain electrode 53 of the TFT and the upper electrode 33 of the storage capacitor.

Further, the TFT includes a data line insulating layer 59 formed below the lower electrode 63 and above a data line 55 and ground line 57. A contact hole 61 is defined exposing the ground line 57, which allows the lower electrode 63 to be connected to the ground line 57.

The TFT is arranged at an intersection between a gate line (not shown) and the data line 55. The gate line is connected to the gate electrode 43 and the data line 55 is connected to the source electrode 51. The gate electrode 43 and the insulating layer 45, which cover the gate electrode 43, are formed on the transparent substrate 41. The gate electrode 43 is made from a conductive metal such as aluminum (Al) or copper (Cu) and the gate insulating layer 45 is made from silicon nitride or silicon oxide. The thickness of the gate insulating film typically can be from 3000 to 5000 Å.

The active layer 47 is formed on the gate insulating layer 45 to overlap with the gate electrode 43, and the ohmic contact layer 49 is formed on the active layer 47 excluding a center portion of the active layer 17. The active layer 47 is formed from amorphous silicon or polycrystalline silicon, and the ohmic contact layer 49 is also made from amorphous silicon or polycrystaline silicon. The active layer 47 is not doped, but the ohmic contact layer 49 is 19 is doped with either an n-type or p-type impurities at high concentrations. The thickness of the active layer can be from about 1500 to 2000 Å and the thickness of the ohmic contact layer 49 can be from about 200 to 500 Å.

The source and drain electrodes 51 and 53 are formed on the ohmic contact layer 49 and spaced from each other. The source and drain electrodes 51 and 53 are formed from molybdenum (Mo), chromium (Cr), titanium (Ti), tantalum (Ta), or from molybdenum alloy such as MoW, MoTa or MoNb, to can have a thickness of approximately 1500 to 2500 Å, and makes an ohmic contact with the ohmic contact layer 49.

The source electrode 51 is connected to the data line 55. Also, the data line 55 and the ground line 57 are formed from the same material as the source and drain electrodes 51 and 53, are formed by the same process that forms the source and drain electrodes 51 and 53, and thus have similar thickness as the source and drain electrodes 51 and 53.

In this embodiment, the data line insulating layer 59 is deposited to cover the structure including the ground line 57 and the data line 55. The data line insulating layer 59 is formed from silicon nitride or silicon oxide and can have a thickness approximately ranging from 1000 to 3000 Å. The contact hole 61 exposing the ground line 57 is defined in the data line insulating layer 59.

The lower electrode 63 is formed on the data line insulating layer 59 and makes contact with the ground line 57 via the contact hole 61. As such, the lower electrode 63 is formed on a plane different from the data line 55 by the insulating layer between layers 59. This prevents any short between the lower electrode 63 and the data line 55 from occurring, even when residual conductive materials are produced upon patterning of the lower electrode 63.

The dielectric layer 65, formed on the data line insulating layer 59, covers the lower electrode 63. The upper electrode 67 is formed on the dielectric layer 65 above the lower electrode 63. The dielectric layer 65 is formed by depositing silicon nitride or silicon oxide and can have a thickness approximately ranging from 2000 to 4000 Å. The lower and upper electrodes 63 and 67 are made from a transparent conductive material such as indium tin oxide (ITO), tin oxide (TO) or indium zinc oxide (IZO) and can have a thickness approximately ranging from 300 to 1000 Å.

Figure 4A:
FIG. 4A to FIG. 4E are sectional views representing a process for fabricating the TFT substrate of the X-ray detecting device shown in FIG. 3.

FIGS. 4A to 4E show a process of fabricating the structure having the upper electrode of the storage capacitor Cst on the TFT substrate of the X-ray detecting device of the present embodiment shown in FIG. 3. Referring to FIG. 4A, a metal, such as aluminum (Al) or copper (Cu), is deposited on the transparent substrate 41 by the sputtering technique to form a thin metal film. The thin metal film is patterned to form the gate electrode 43, connected to the gate line (not shown) by photolithography including wet etching.

Figure 4B:
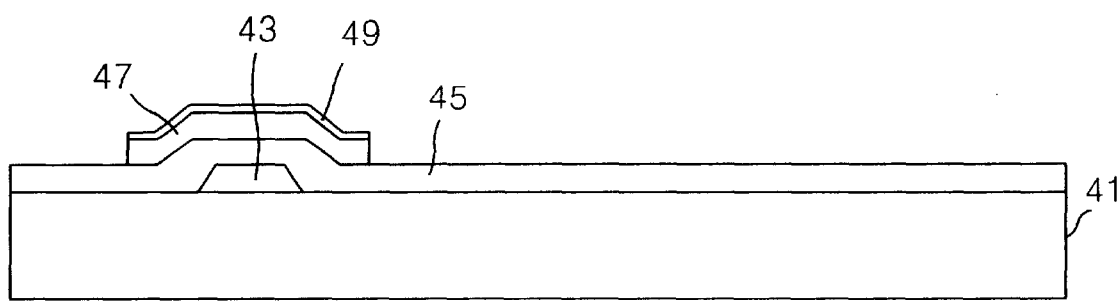

Referring to FIG. 4B, the gate insulating layer 45, the active layer 47 and the ohmic contact layer 49 are sequentially formed on the transparent substrate 41 by the chemical vapor deposition (CVD) technique and cover the gate electrode 43. The gate insulating layer 45 is formed by depositing an insulation material such as silicon oxide or silicon nitride and can have a thickness approximately ranging from 3000 to 5000 Å.

The active layer 47 is formed by depositing amorphous silicon or polycrystalline silicon to a thickness approximately ranging from 1500 to 2000 Å. The ohmic contact layer 49 is also formed by depositing amorphous silicon or polycrystalline silicon and can have a thickness that can be approximately range from 200 to 500 Å. The active layer 47 is not doped, but the ohmic contact layer 49 is doped with either n or p-type impurities at high concentrations.

The ohmic contact layer 49 and the active layer 47 are patterned by photolithography including anisotropic so that a desired portion corresponding to the gate electrode 43 remains.

Figure 4C:
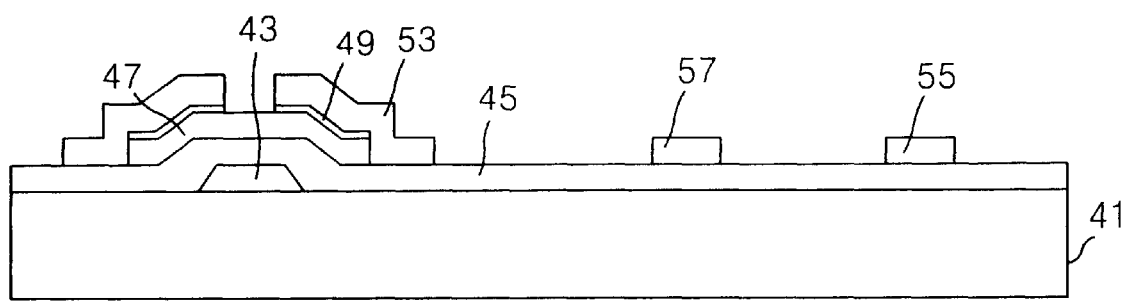

Referring to FIG. 4C, a metal such as molybdenum (Mo), chromium (Cr), titanium (Ti), tantalum (Ta), or from molybdenum alloys such as MoW, MoTa or MoNb, is deposited on the gate insulating film 45 by the CVD or sputtering technique and can have a thickness of about 1500 to 2500 Å to cover the ohmic contact layer 49. The metal or the metal alloy so deposited makes an ohmic contact with the ohmic contact layer 49.

Then, the source and drain electrodes 51 and 53 are formed by patterning the metal or the metal alloy by photolithography so that portions corresponding to each side of the active layer 47 remain. At this time, the data line 55 and the ground line 57 are also formed, both of which are perpendicular to the gate line (not shown).

When the source and drain electrodes 51 and 53 are formed, a portion of the ohmic contact layer 49 between the source and drain electrodes 51 and 53 is patterned to expose the active layer 47. A portion of the active layer 47 above the gate electrode 43 and between the source and drain electrodes 41 and 43 becomes a channel.

Figure 4D:
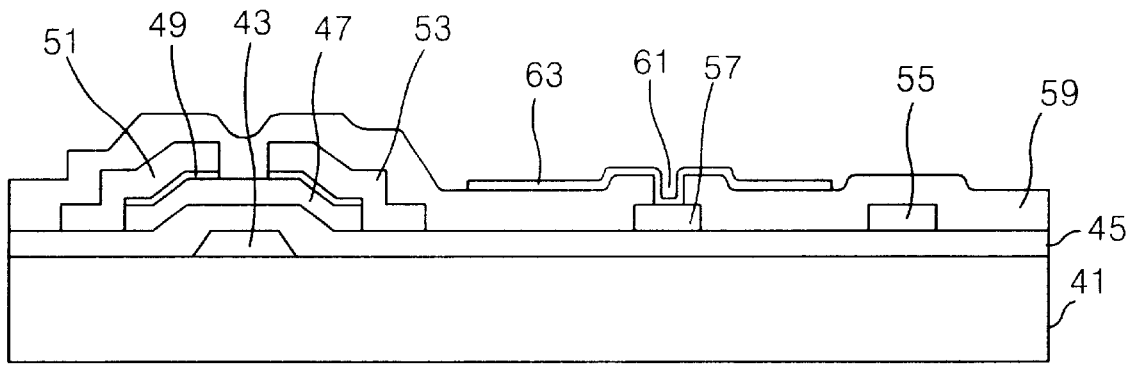

Referring to FIG. 4D, the data line insulating layer 59 is formed by depositing silicon nitride or silicon oxide on the gate insulating layer 45 to a thickness that can approximately range from 1000 to 3000 Å to cover the TFT, the data line 55 and the ground line 57. Then, the data line insulating layer 59 is patterned by the photolithography to expose the ground line 57 to define the contact hole 61.

A transparent conductive material such as ITO, TO or IZO is then deposited on the data line insulating layer 59 to a thickness that can approximately range from 300 to 1000 Å. The transparent conductive material makes contact with the ground line 57 via the contact hole 61. Then, the transparent conductive material is patterned by the photolithography including the wet etching to form the lower electrode 63 of the storage capacitor Cst. The lower electrode 63 remains electrically connected to the ground line 57.

However, the data line insulating layer 59 prevents the lower electrode 63 from shorting with the data line 55 even if residual conductive materials are produced upon subsequent patterning processes.

Figure 4E:
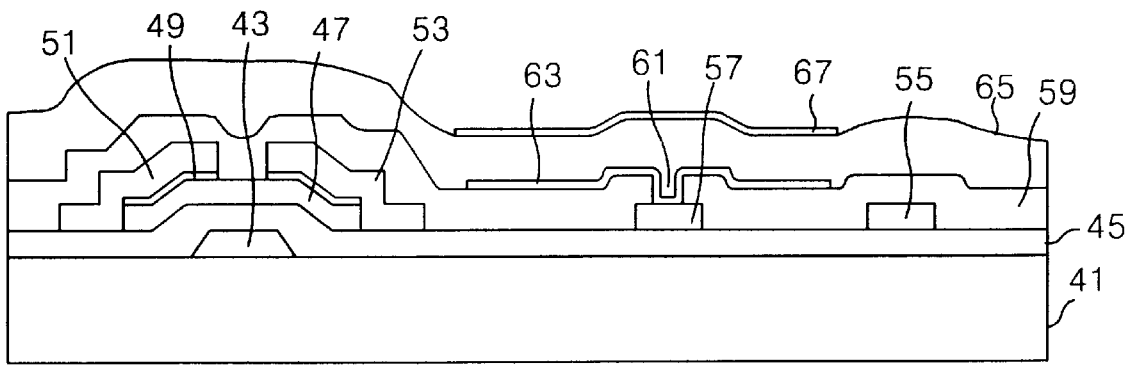

Referring to FIG. 4E, silicon nitride or silicon oxide is deposited on the insulating layer between layers 59 to a thickness that can approximately range from 2000 to 4000 Å to cover the lower electrode 63, thereby forming the dielectric layer 65. The dielectric layer 65 is used as a dielectric film of the storage capacitor Cst.

Subsequently, a transparent conductive material such as indium tin oxide (ITO), tin oxide (TO) or indium zinc oxide (IZO) is deposited on the dielectric layer 65 to a thickness that can approximately range from 300 to 1000 Å. Then, the transparent conductive material is patterned by the photolithography including wet etching to form the upper electrode 67 of the storage capacitor Cst. The upper electrode 67 can be formed directly above lower electrode 63.

As described above, according to the present invention, the data line insulating layer 59 is formed on the data line and the ground line. Then, the contact hole for exposing the ground line is defined by patterning the data line insulating layer. Then the lower electrode of the storage capacitor contacting the ground via the contact hole is formed. Accordingly, even when residual conductive materials are produced upon formation of the lower electrode of the storage capacitor, a short between the lower electrode and the data line is prevented.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An X-ray detecting device, comprising:
    a transparent substrate;
    a gate electrode formed on the transparent substrate;
    a gate-insulating layer formed on the transparent substrate covering the gate electrode;
    an active layer formed on a first portion of the gate-insulating layer over the gate electrode;
    an ohmic contact layer formed on each side of the active layer such that a center portion of said ohmic contact layer is removed;
    a thin film transistor including source and drain electrodes formed on the ohmic contact layer;
    a data line formed on a second portion of the gate insulating layer and electrically connected to the source electrode;
    a ground line provided on a third portion of the gate-insulating layer;
    a data line insulating layer formed on the gate insulating layer such that the data line is covered and a contact hole is defined in the data line insulating layer exposing the ground line;
    a lower electrode of a storage capacitor contacting the ground line via the contact hole on the data line insulating layer;
    a dielectric layer formed on the data line insulating layer covering said lower electrode of a storage capacitor; and
    an upper electrode formed on the dielectric layer above the lower electrode.

2. The X-ray detecting device according to claim 1, wherein the data line insulating layer is formed from one of silicon nitride and silicon oxide.

3. The X-ray detecting device according to claim 2, wherein the data line insulating layer has a thickness ranging from 1000 to 3000 Å.

4. The X-ray detecting device according to claim 1, wherein the dielectric layer is formed from one of silicon nitride and silicon oxide.

5. The X-ray detecting device according to claim 4, wherein the dielectric layer has a thickness ranging from 2000 to 4000 Å.

6. The X-ray detecting device according to claim 1, wherein at least one of the lower and upper electrodes is formed from one of indium tin oxide (ITO), tin oxide (TO) and indium zinc oxide (IZO).

7. The X-ray detecting device according to claim 1, wherein said at least one of the lower and upper electrodes has a thickness ranging from 300 to 1000 Å.

8. A method of fabricating an X-ray detecting device, comprising:
    forming a gate electrode on a transparent substrate;
    sequentially forming a gate insulating layer, an active layer and an ohmic contact layer covering the gate electrode and patterning the ohmic contact layer and the active layer such that the ohmic contact layer and the active layer remain above the gate electrode on a first portion of the gate insulating layer;
    forming source and drain electrodes on each side of the active layer, the source and drain electrodes making contact with ohmic contact layer and, at the same time, forming a data line and a ground line at second and third portions, respectively, of the gate insulating layer;
    forming a data line insulating layer covering the data line and the ground line on the gate insulating layer and then patterning the data line insulating layer to define a contact hole for exposing the ground line;
    forming a lower electrode of a storage capacitor on the data line insulating layer contacting the ground line via the contact hole above;
    forming a dielectric layer on the data line insulating layer covering said lower electrode of a storage capacitor; and
    forming an upper electrode on the dielectric layer above the lower electrode.

9. The method according to claim 8, wherein the data line insulating layer is made from one of silicon nitride and silicon oxide.

10. The method according to claim 9, wherein the data line insulating layer has a thickness ranging from 1000 to 3000 Å.

11. The method according to claim 8, wherein the dielectric layer is formed from one of silicon nitride and silicon oxide.

12. The method according to claim 11, wherein the dielectric layer has a thickness ranging from 2000 to 4000 Å.

13. The method according to claim 8, wherein at least one of the lower and upper electrodes is formed from one of indium tin oxide (ITO), tin oxide (TO) or indium zinc oxide (IZO).

14. The method according to claim 13, wherein said at least one of the lower and upper electrodes has a thickness ranging from 300 to 1000 Å.

15. The method according to claim 8, wherein a chemical vapor deposition technique is used to sequentially form at the gate insulating layer, the active layer and the ohmic contact layer.

16. An X-ray detection device, comprising:
   a thin film transistor (TFT) structure on a substrate including a data line and a ground line;
   a data line insulating layer formed on said substrate covering said data and ground lines such that said data line insulating layer has a contact hole exposing said ground line;
   a lower electrode of a storage capacitor on said data line insulating layer above said data line such that said lower electrode is electrically connected to said ground line via said contact hole;
   a dielectric layer formed above said lower electrode; and
   an upper electrode of said storage capacitor formed on said dielectric layer above said lower electrode.

17. The X-ray detecting device of claim 16, wherein said data line insulating layer is formed from one of silicon nitride and silicon oxide.

18. The X-ray detecting device of claim 17, wherein the data line insulating layer has a thickness ranging from 1000 to 3000 Å.

19. The X-ray detecting device of claim 16, wherein the dielectric layer is formed from one of silicon nitride or silicon oxide.

20. The X-ray detecting device of claim 19, wherein the dielectric layer has a thickness ranging from 2000 to 4000 Å.

21. The X-ray detecting device of claim 16, wherein at least one of the lower and upper electrodes is formed from one of indium tin oxide (ITO), tin oxide (TO) or indium zinc oxide (IZO).

22. The X-ray detecting device of claim 21, wherein said at least one of the lower and upper electrodes has a thickness ranging from 300 to 1000 Å.

23. A method to form an X-ray detection device, comprising:
   forming a thin film transistor (TFT) structure on a substrate including a data line and a ground line;
   forming a data line insulating layer on said substrate covering said data and ground lines such that said data line insulating layer has a contact hole exposing said ground line;
   forming a lower electrode of a storage capacitor on said data line insulating layer above said data line such that said lower electrode is electrically connected to said ground line via said contact hole;
   forming a dielectric layer above said lower electrode; and
   forming an upper electrode of said storage capacitor on said dielectric layer above said lower electrode.

24. The method of claim 23, wherein the step of forming said data line insulating layer comprises:
   depositing one of silicon nitride and silicon dioxide layer on said substrate covering said data and ground lines; and
   patterning said one of silicon nitride and silicon dioxide layer defining said contact hole exposing said ground line.

25. The method of claim 24, wherein said one of silicon nitride and silicon dioxide layer is deposited to a thickness ranging from 1000 to 3000 Å.

26. The method of claim 23, wherein the step of forming said lower electrode comprises:
   depositing a first transparent conductive material on said data line insulating layer such that said transparent conductive material makes contact with said data line via said contact hole; and
   patterning said transparent conductive material so that at least a portion above said data line remains.

27. The method of claim 26, wherein said first transparent conductive material is deposited to a thickness ranging from 1000 to 3000 Å.

28. The method of claim 27, wherein said first transparent conductive material is made from one of indium tin oxide (ITO), tin oxide (TO) or indium zinc oxide (IZO).

29. The method of claim 23, wherein the step of forming said dielectric layer comprises:
   depositing one of silicon nitride and silicon dioxide layer on said data line insulating layer covering said lower electrode.

30. The method of claim 29, wherein said one of silicon nitride and silicon dioxide layer is deposited to a thickness ranging from 2000 to 4000 Å.

31. The method of claim 23, wherein the step of forming said upper electrode comprises:
   depositing a second transparent conductive material on said dielectric layer; and
   patterning said transparent conductive material so that at least a portion above said lower electrode remains.

32. The method of claim 31, wherein said second transparent conductive material is deposited to a thickness ranging from 1000 to 3000 Å.

33. The method of claim 32, wherein said second transparent conductive material is made from one of indium tin oxide (ITO), tin oxide (TO) or indium zinc oxide (IZO).

34. The method of claim 23, wherein said data and ground lines are formed simultaneously with source and drain electrodes of said TFT structure.

* * * * *